United States Patent
Hull et al.

(10) Patent No.: US 7,501,900 B2
(45) Date of Patent: Mar. 10, 2009

(54) PHASE-LOCKED LOOP BANDWIDTH CALIBRATION

(75) Inventors: Christopher Hull, Portland, OR (US); Russell Fagg, San Diego, CA (US); Dandan Li, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 248 days.

(21) Appl. No.: 11/444,076

(22) Filed: May 31, 2006

(65) Prior Publication Data

US 2007/0279135 A1    Dec. 6, 2007

(51) Int. Cl.
*H03L 7/085* (2006.01)
*H03L 7/00* (2006.01)
*H03L 7/099* (2006.01)
*H03B 5/10* (2006.01)
*H03B 5/12* (2006.01)
*H03J 7/04* (2006.01)

(52) U.S. Cl. ................ 331/16; 331/1 A; 331/177 R; 331/34; 331/179

(58) Field of Classification Search ............... 331/1 A, 331/16, 17, 18, 25, 44
See application file for complete search history.

(56) References Cited

U.S. PATENT DOCUMENTS

| | | | | |
|---|---|---|---|---|
| 5,703,539 | A | * 12/1997 | Gillig et al. | 331/16 |
| 5,838,202 | A | * 11/1998 | Kosiec et al. | 331/1 A |
| 7,095,287 | B2 | * 8/2006 | Maxim et al. | 331/44 |
| 2005/0258907 | A1 | * 11/2005 | Zachan et al. | 331/16 |
| 2007/0013446 | A1 | * 1/2007 | Navil et al. | 331/16 |

OTHER PUBLICATIONS

Applied Radio Labs, Oct. 15, 1999, Measuring the Loop Bandwidth of a PLL.

* cited by examiner

*Primary Examiner*—Wael Fahmy
*Assistant Examiner*—Gerald Stevens
(74) *Attorney, Agent, or Firm*—Carrie A. Boone, P.C.

(57) ABSTRACT

A novel circuit for obtaining the bandwidth of a phase-locked loop circuit is disclosed. The circuit adjusts a phase of a signal (reference or generated), causing the phase-locked loop circuit to adjust the frequency of its voltage-controlled oscillator as it recovers a phase lock. The circuit times the duration of the recovery stage, from which the loop bandwidth may be obtained. Adjustments to the programmable portions of the phase-locked loop may then be made in accordance with design specifications.

8 Claims, 8 Drawing Sheets

PHASE-LOCKED LOOP BANDWIDTH CALIBRATION

TECHNICAL FIELD

This disclosure relates to phase-locked loops and, more particularly, to the bandwidth of a phase-locked loop.

BACKGROUND

The increasing demand for low cost, miniaturized, power efficient communication systems is driving demand for higher levels of functionally to be incorporated within integrated circuits. Phase-locked loop circuits are not immune to these demands. A phase-locked loop (PLL) is a circuit that maintains a signal in a fixed phase relationship to another signal, known as the reference signal. A type of closed-loop feedback control system, PLLs may be dispersed throughout a design to support various system functions.

A PLL circuit may consist of a reference signal, a phase detector and a voltage-controlled oscillator (VCO), arranged in a negative feedback configuration. Additionally, a filter, a charge pump, and a divider may be present. The VCO generates a periodic output signal that is fed back into the phase detector (or, alternatively, a phase frequency detector). When the output signal is not phase-aligned with the reference signal, the phase detector sends a pulse to the VCO (or intervening circuitry), causing the frequency of the output signal to change. The frequency shift persists until the phase of the output signal is back into alignment with the reference. In reality, the frequency shift will not be instantaneous, and will result in an overshoot of the phase correction. Eventually, the phase and frequency of the loop will both settle to the correct value, but there will be several perturbations back and forth of the relative phase of the reference and output signal.

Figure 1:
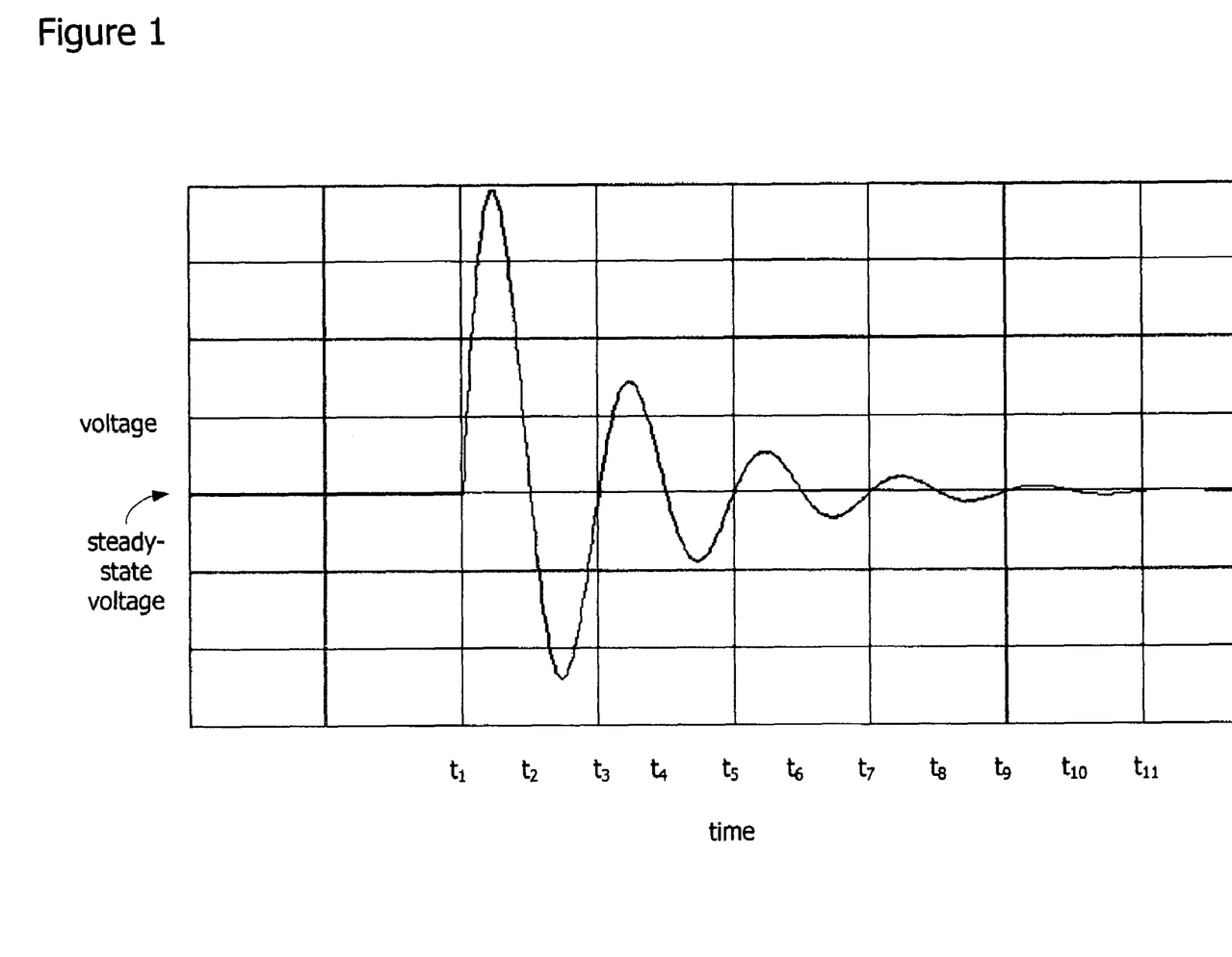
FIG. 1 is a graph of a voltage being supplied to a voltage controlled oscillator when a phase discontinuity occurs in a phase-locked loop system, according to the prior art.

In FIG. 1, for example, a graph shows a voltage over time, which may represent the analog voltage fed into the VCO of the PLL circuit. At a time, $t_1$, the voltage changes from a steady-state voltage to a voltage greater than the steady-state voltage; at time $t_2$, the voltage crosses the steady-state voltage line and is less than the steady-state voltage; at time, $t_3$, the voltage again crosses the steady-state voltage and is greater than the steady-state voltage. The voltage thus oscillates across the steady-state voltage, until finally achieving the steady-state voltage at approximately time, $t_{11}$.

The PLL circuit design involves two competing phenomena: locking speed and jitter. The locking speed is how fast the PLL is able to lock the output signal to the reference signal litter is a variation of the signal over time, and may include phenomena such as signal skew and coupled noise. The bandwidth of the PLL, a process variant parameter, together with the VCO phase noise and the reference chain noise, determines what the locking speed and the jitter of the PLL will be. A PLL with a high loop bandwidth provides a fast lock time; however, jitter on the reference signal passes through to the output signal with little or no attenuation. A PLL with a low loop bandwidth filters out the jitter in the reference signal, but is slower to lock the output signal to the reference signal. Such a PLL will also not attenuate the phase jitter of the VCO by much. Knowing the PLL loop bandwidth may facilitate the design of the PLL, whatever the system requirements.

Some PLL designs place tight restrictions upon the tolerance of the PLL components. This ensures that the PLL loop bandwidth falls within an acceptable window. Component variables within the PLL that contribute to PLL closed loop bandwidth include the tuning sensitivity of the VCO, component values of the loop filter, values programmed Into the feedback divider, and the gain of the phase detector (or phase frequency detector) and the charge pump. Some prior art designs rely upon schemes such as injecting test signals into strategic circuit nodes and measuring the resultant sidebands at the PLL output.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a novel circuit is disclosed for obtaining the loop bandwidth of a phase-locked loop circuit. The novel circuit adjusts a phase of a signal, causing the phase-locked loop circuit to react by adjusting the frequency of a voltage-controlled oscillator to try to recover a phase lock between the signal and a second signal. The novel circuit times the duration of the recovery stage, from which the loop bandwidth may be obtained. Adjustments to the programmable portions of the phase-locked loop may then be made in accordance with design specifications.

In the following detailed description, reference is made to the accompanying drawings, which show by way of illustration specific embodiments in which the described subject matter may be practiced. However, it is to be understood that other embodiments will become apparent to those of ordinary skill in the art. The following detailed description is, therefore, not to be construed in a limiting sense.

Figure 2:
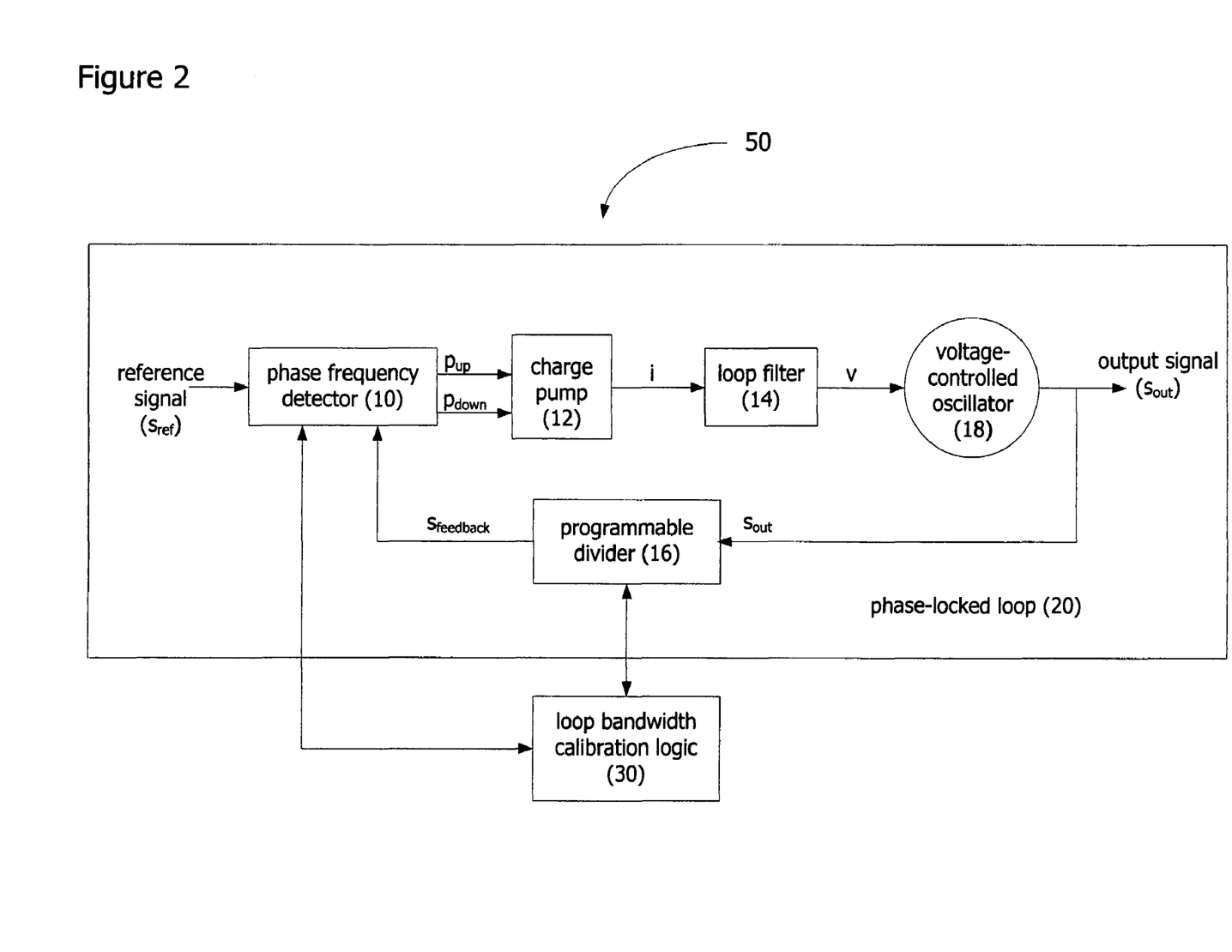
FIG. 2 is a block diagram of a novel circuit including a phase-locked loop circuit and loop bandwidth calibration logic, according to some embodiments.

FIG. 2 is a block diagram of a novel circuit 50, according to some embodiments. The novel circuit 50 includes a phase-locked loop (PLL) circuit 20 and loop bandwidth calibration logic 30. As described below, the loop bandwidth calibration logic 30 generates a time value, or duration, from which the closed loop bandwidth of the PLL 20 may be inferred. The time value thus enables system designers to automatically or manually calibrate the PLL 20 according to the system design.

The closed loop of the PLL circuit 20 includes a phase frequency detector 10, a charge pump 12, a loop filter 14, a voltage-controlled oscillator (VCO) 18, and a programmable divider 16. A reference signal, $s_{ref}$, having a frequency, $f_{ref}$, and a phase, $\phi_{ref}$, is received into the phase frequency detector 10 while the VCO 18 generates an output signal, $s_{out}$, having a frequency, $f_{out}$ and a phase, $\phi_{out}$. During operation, the output signal, $s_{out}$, becomes locked with the reference signal, $s_{ref}$, such that the output phase, $\phi_{out}$, is substantially similar to the reference phase, $\phi_{ref}$. The novel circuit 50 may be operable with PLL circuits having fewer or more features than those specifically depicted in FIG. 2.

The phase frequency detector 10 receives the reference signal, $s_{ref}$, as well as the output signal, $s_{out}$, the latter of which may have been modified by the programmable divider 16 (shown as $s_{feedback}$) before being received into the phase frequency detector 10. The phase frequency detector 10 thus compares the two signals, $s_{ref}$ and $s_{feedback}$. When the two signals are substantially similar in phase, the PLL circuit 20 is locked. When the two signals are not substantially similar in phase, the phase frequency detector 10 generates a voltage pulse whose duration is proportional to the difference in phase between $s_{ref}$ and $s_{feedback}$, in other words, a difference between $\phi_{ref}$ and $\phi_{feedback}$. Where $\phi_{ref}$ is greater than $\phi_{feedback}$ an up pulse ($p_{up}$) is generated; where $\phi_{ref}$ is less than $\phi_{feedback}$, a down pulse ($p_{down}$) is generated.

The charge pump 12 receives the voltage pulse, $p_{up}$ or $p_{down}$, from the phase frequency detector 10 and converts the pulse into a current pulse, i. The current pulse, i, is then sent to the loop filter 14. There, the current pulse is converted into an analog voltage, v. The loop filter 14 also filters out high-frequency noise transmitted to the VCO 18. The analog voltage controls the frequency of an oscillator, updating the characteristics of the output signal, $s_{out}$. The output signal, $s_{out}$, is fed into the programmable divider 16, to generate the signal, $s_{feedback}$, which is fed back into the phase frequency detector 10, for subsequent comparison with the reference signal, $s_{ref}$. The closed loop of the PLL 20 is thus completed.

The PLL correction continues until the reference signal, $s_{ref}$, and the feedback signal, $s_{feedback}$, are substantially similar in phase. At this point, the PLL 20 is said to be in phase lock with the reference signal, $s_{ref}$. In this state, the phase frequency detector 10 produces short charge refill pulses ($p_{up}$ or $p_{down}$) of substantially equal magnitude every reference period. This maintains the locked state, but linearizes the response of the phase detector to prevent a dead zone near the locked state. A dead zone is a band where the charge pump does not show any response to small deviations in phase difference between the reference signal, $s_{ref}$, and the feedback signal, $s_{feedback}$. Dead zones are caused by finite turn-on times of the charge pump. Use of short refill pulses of substantially equal magnitude and opposite sign ensures that the charge pumps have time to turn on, eliminating the dead zone.

From control systems theory, it is known that the timed step response and frequency bandwidth of a closed loop system are related. This is so provided that the step applied to the control system does not cause the control system to operate outside its linear operating range. Thus, by measuring the time it takes for the PLL to overshoot in response to a step change in input phase, it is possible to measure of the PLL's closed loop bandwidth. The loop bandwidth calibration logic 30 in FIG. 2 is designed with this principle in mind.

In FIG. 2, the loop bandwidth calibration logic 30 is shown coupled to the programmable divider 16 and the phase frequency detector 10. The loop bandwidth calibration logic 30 is depicted more fully in the block diagrams of FIGS. 3A and 3B, according to some embodiments. The logic 30 includes phase overshoot detection logic 26, a counter 24, and adjust logic 28. A clock 22 controls the counter 24, which generates a time value, $T_{cal}$. The logic elements of the loop bandwidth calibration logic are representative of the functional aspects of the logic 30, and are not necessarily indicative of its actual structure. Each of these functional units is described in more detail in the description of FIG. 4, below.

The loop bandwidth calibration logic 30 operates by modifying either the feedback phase, $\phi_{feedback}$ (FIG. 3B), or the reference phase, $\phi_{ref}$ (FIG. 3A), of a PLL that is in its stable state ("locked stage"). The modification will cause the PLL 20 to commence recovery of the signal, as described above. The loop bandwidth calibration logic 30 calculates the time it takes for the PLL 20 to reach what is known herein as an "overshoot stage" of operation. The time, or duration, of the PLL loop bandwidth may then be used to automatically or manually calibrate the PLL 20 according to system design specifications.

Figure 5:
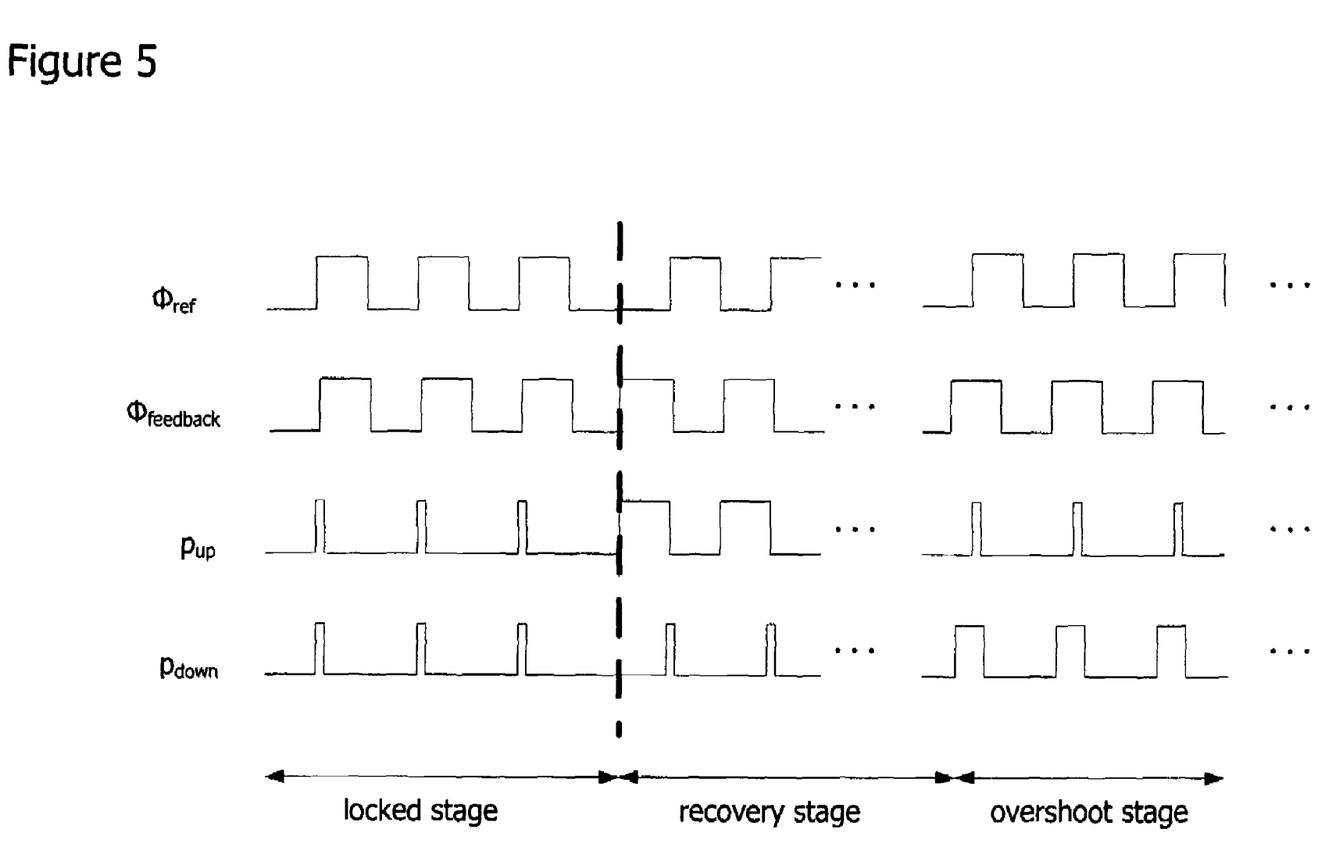
FIG. 5 is a timing diagram showing operation of the novel circuit of FIG. 2, according to some embodiments.

FIG. 5 is a timing diagram depicting three phases of the PLL operation: a locked stage, a recovery stage, and an overshoot stage. The overshoot stage is a time period in which the PLL 20 has achieved a "lock" between the phases, $\phi_{ref}$ and $\phi_{feedback}$, of the signals, $s_{ref}$ and $s_{feedback}$, as described above. The recovery stage is a time period in which the PLL 20 has identified a mismatch between the phase signals, $\phi_{ref}$ and $\phi_{feedback}$ and is changing the voltage, v, that is fed into the VCO 18, causing the phase signal, $\phi_{feedback}$ to track the phase signal, $\phi_{ref}$. The recovery stage, however, ends when the voltage, v, which is fed into the VCO 18 changes from being greater than a steady-state voltage to being less than a steady-state voltage (or vice-versa). In other words, the voltage crosses a steady-state voltage and changes from a phase lead to a phase lag, or vice-versa. For example, in FIG. 1, such a steady-state voltage crossing first occurs at time, $t_2$, then occurs subsequently at times $t_3$, $t_4$, $t_5$, $t_6$, $t_7$, etc. (Alternatively, the recovery stage may be described as a period of time between when the phase-locked loop is in the locked stage and when the voltage, v, fed into the VCO 28 first reaches its steady-state value.) At the steady-state crossing point, the PLL 20 is in a first overshoot stage. Although not depicted in FIG. 5, there may be subsequent overshoot stages before the phase signals, $\phi_{ref}$ and $\phi_{feedback}$, become locked. The loop bandwidth calibration logic 30 thus measures the length (time) of the recovery stage of the PLL 20.

Figure 4:
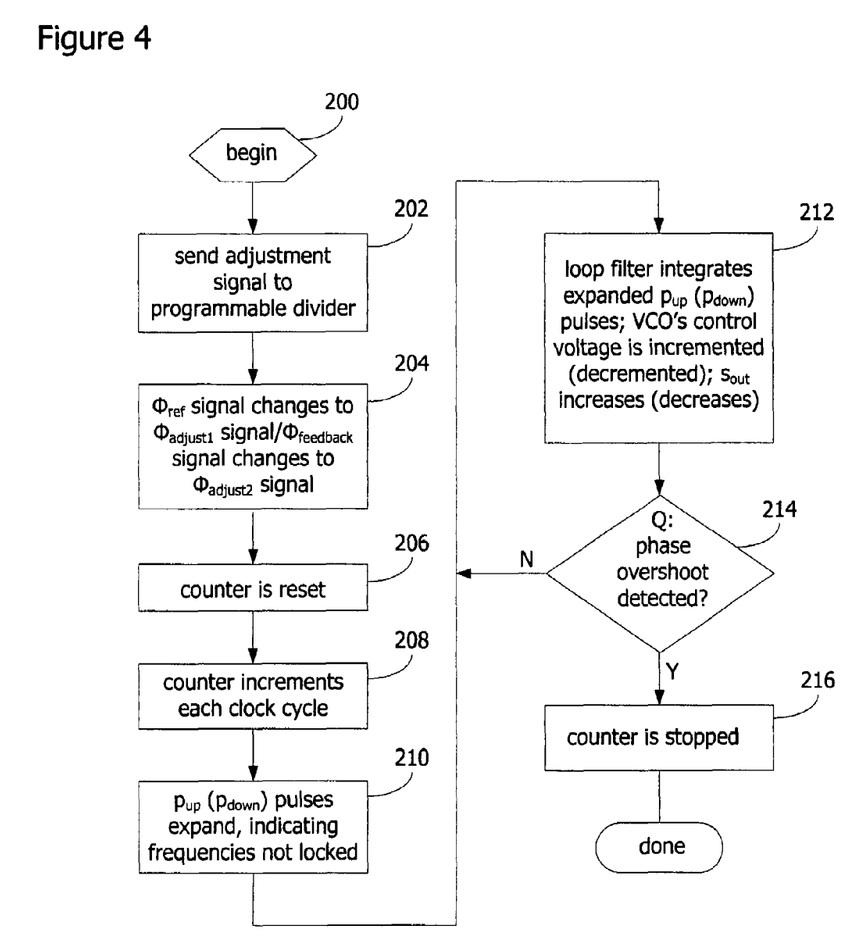
FIG. 4 is a flow diagram showing operation of the loop bandwidth calibration logic of FIG. 3A or 3B, according to some embodiments.

In FIG. 4, flow diagram 200 shows the operation of the novel circuit 50, including the loop bandwidth calibration logic 30, according to some embodiments. The operations depicted in the flow diagram 200 may occur in an order different than is depicted, and some operations may be combined or performed simultaneously. System designers of ordinary skill in the art will recognize a number of possible implementations represented in the flow diagram 200 of FIG. 4.

Figure 3A:
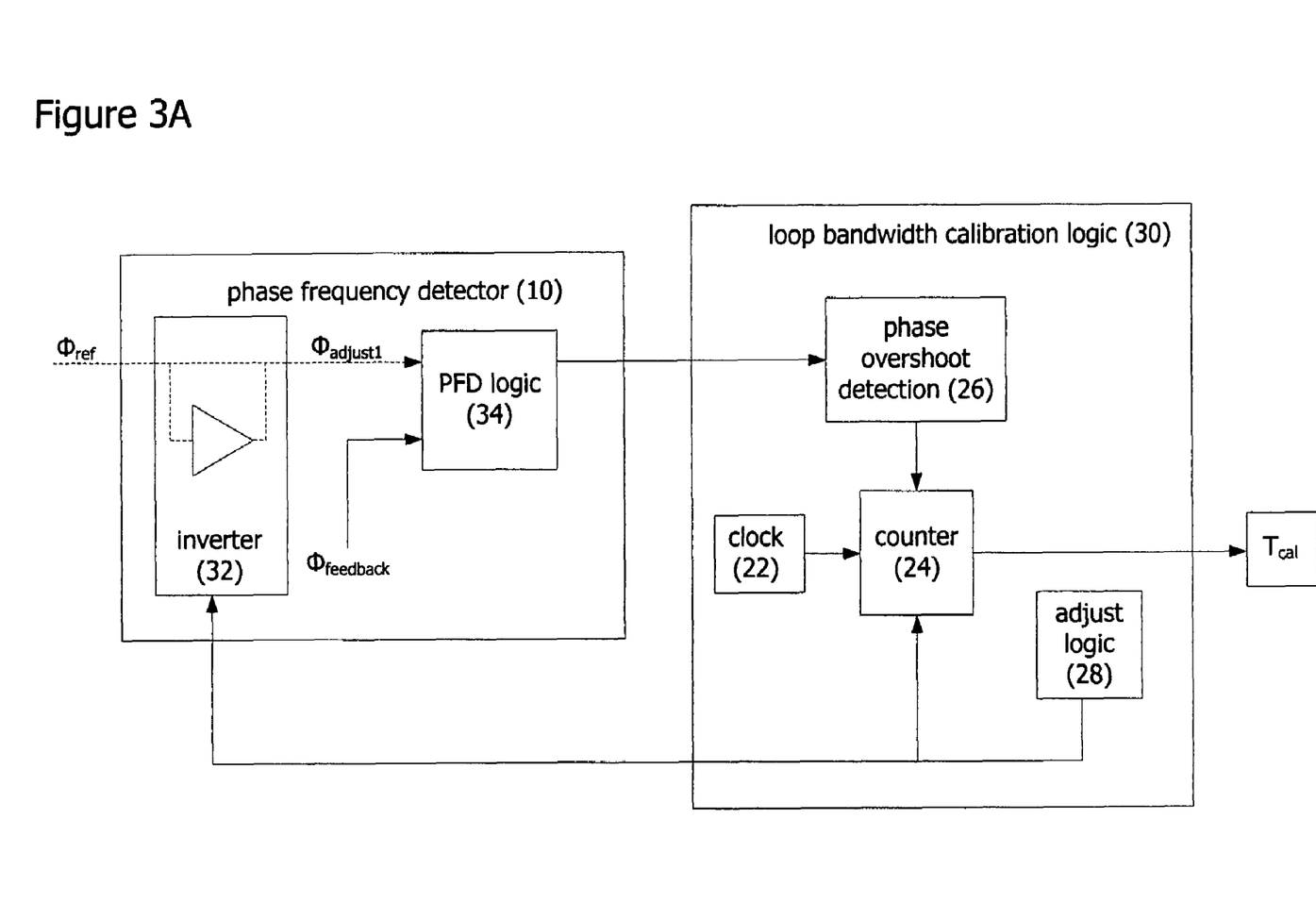
FIG. 3A is a block diagram of the loop bandwidth calibration logic used by the novel circuit of FIG. 2, according to some embodiments.
Figure 3B:
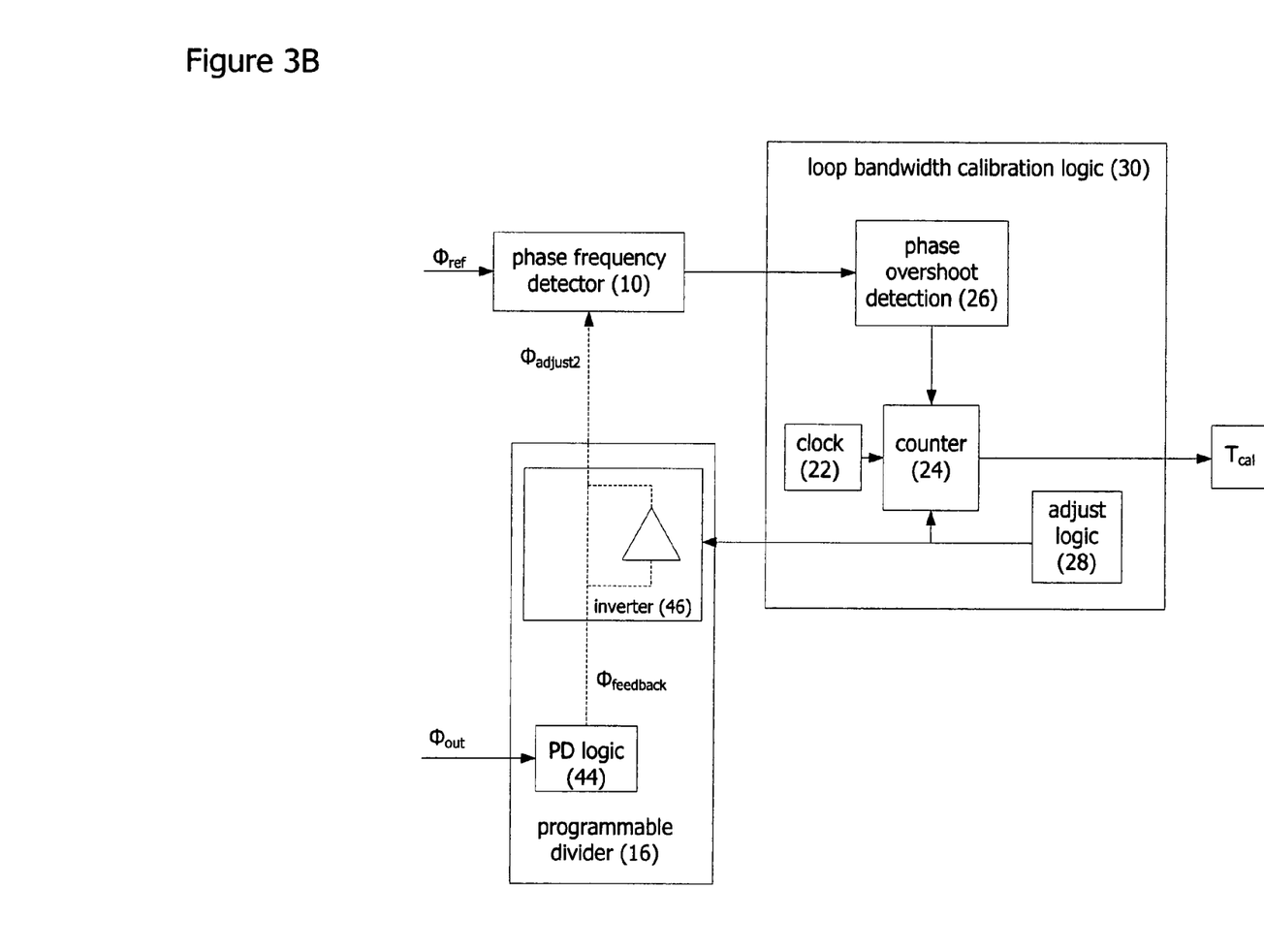
FIG. 3B is a block diagram of the loop bandwidth calibration logic used by the novel circuit of FIG. 2, according to some embodiments.

In the embodiment of FIG. 3A, the reference phase, $\phi_{ref}$, is adjusted; in the embodiment of FIG. 3B, the feedback phase, $\phi_{feedback}$ is adjusted. Both embodiments are described herein. In FIG. 3A, the adjust logic 28 of the loop bandwidth calibration logic 30 sends an adjustment signal to an inverter 32, indicating that the phase, $\phi_{ref}$, of the reference signal, $s_{ref}$, is to be changed (block 202). (Although shown in FIG. 3A as being inside the phase frequency detector 10, the inverter 32 may be thought of as part of the adjust logic 28.) This causes the phase, $\phi_{ref}$, to change to a new signal, shown in FIG. 3A as $\phi_{adjust1}$ (block 204). The adjustment to the signal may vary. In the embodiment of FIG. 3, the phase, $\phi_{ref}$, is inverted, for a 180° shift in the $\phi_{adjust1}$ signal. However, the phase, $\phi_{ref}$, may be adjusted by amounts other than 180°. In FIG. 3B, the programmable divider 16 is shown with an inverter 46. The adjust logic 28 sends a signal to the inverter 46, causing the phase of the feedback signal, $\phi_{feedback}$, to be adjusted (shown in FIG. 3B as $\phi_{adjust2}$). Again, the adjustment may be by an amount other than 180°. Thus, in the first example (FIG. 3A), $\phi_{ref}$ is replaced with $\phi_{adjust1}$; in the second example (FIG. 3B), $\phi_{feedback}$ is replaced with $\phi_{adjust2}$. For either adjustment, the change in phase of one of the signals being compared by the phase frequency detector 10 causes the PLL 20 to leave the locked phase and enter the recovery stage. Accordingly, the counter 24 is reset (block 206), allowing the loop bandwidth calibration logic 30 to track the recovery stage duration. The counter 24 is controlled by a clock 22, whose frequency may be adjusted according to the desired level of accuracy. The counter 24 increments at each cycle of the clock 22 (block 208).

During the recovery stage, the voltage pulses $p_{up}$ ($p_{down}$) fed into the charge pump 12 expand, indicating that the signals, $s_{adjust1}$ and $s_{feedback}$ (or $s_{ref}$ and $s_{adjust2}$), are not locked (block 210). In the timing diagram of FIG. 5, the phase, $\phi_{feedback}$, lags the phase, $\phi_{ref}$, by 180°; the up pulse, $p_{up}$, fed into the charge pump 12 is wide while the down pulse, $p_{down}$, fed into the charge pump is small. The charge pump 12 converts the pulse into a current pulse, i, which is sent to the loop filter 14. The loop filter 14 integrates the current pulse, causing the voltage, v, into the VCO 18 to be incremented (decremented), which, in turn, causes the signal, $s_{out}$, to increase (decrease) (block 212).

At some point, the voltage, v, being fed into the VCO 18 will be too great, causing the PLL 20 to enter the overshoot stage (block 214). This is because the PLL 20 is under-damped. (Recall from FIG. 1 the voltage characteristic of an under-damped system.) In FIG. 5, the timing diagram shows that the phase, $\phi_{ref}$, leads the phase, $\phi_{feedback}$, during the recovery stage. Once the PLL 20 is in the overshoot stage, the phase, $\phi_{feedback}$, slightly leads the phase, $\phi_{ref}$. Thus, the voltage being fed into the VCO 18 goes from being greater than the steady-state voltage to becoming less than the steady-state voltage (or vice-versa). Once the PLL 20 is in the overshoot stage, the counter 24 is stopped (block 216). Accordingly, the loop bandwidth calibration logic 30 generates a time value, $T_{cal}$, from which the loop bandwidth of the PLL 20 may be inferred.

Once the loop bandwidth of the PLL is known, the adjustable features of the PLL 20 may be modified. This may be done automatically or manually, as desired. The PLL closed loop bandwidth is proportional to the current, i, of the charge pump 12. The charge pump 12 may include some programmable registers that enable its characteristics to be changed. Accordingly, in some embodiments, once the PLL loop bandwidth is known, the characteristics of the charge pump 12 may be changed, then a new PLL loop bandwidth may be calculated. In this manner, it is possible to conform the PLL 20 to the desired design specifications. Other PLL components may be modified, as desired, using the PLL loop bandwidth as a guide for calibrating the PLL.

The novel circuit 50 provides several benefits, according to some embodiments. The loop bandwidth calibration logic 30 involves minimal additional hardware for automatically obtaining the loop bandwidth of the PLL 20. Thus, the design adds little to the die area or power consumption of the PLL circuit 20. Further, the PLL 20 may be calibrated during system design, rather than relying upon factory trimming of components. This may reduce the production time and maximize the manufacturing throughput, in some embodiments. The calibration of the PLL 20 may be repeated at will, such as following a change in the operating conditions, such as when the temperature of a device changes. Also, the accuracy of the PLL loop bandwidth calculation may be as high as desired, limited by the calibration time (frequency of the clock 22) and the length of the counter 24 (FIG. 3).

Figure 6:
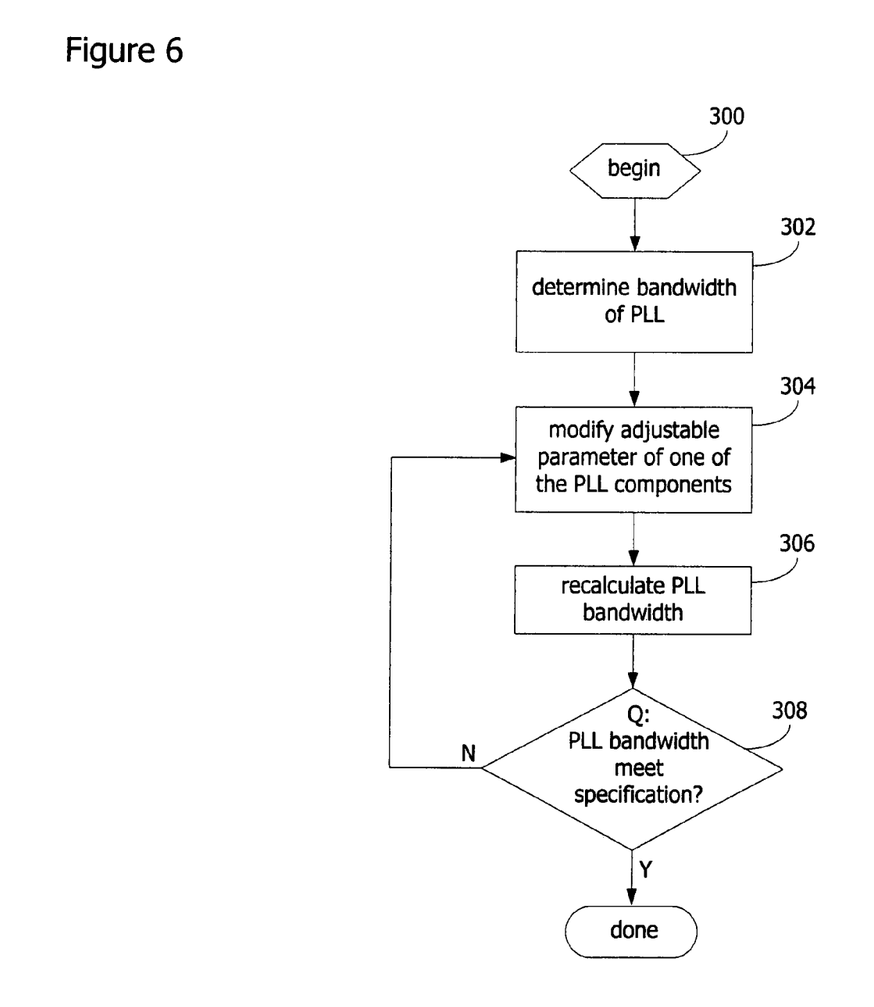
FIG. 6 is a flow diagram showing calibration of the PLL circuit following calculation of the loop bandwidth by the novel circuit of FIG. 2, according to some embodiments.

FIG. 6 is a flow diagram 300 depicting a method for using the novel circuit 50, according to some embodiments. As described above, the novel circuit 50 is capable of inferring the closed loop bandwidth of the PLL 20 (block 302), based upon the calculated duration of the recovery stage of the PLL. From this information, the system designer is able to adjust one or more parameters of the PLL circuitry, such as the charge pump 12 (block 304). The PLL loop bandwidth may again be calculated (block 306). This process may be repeated until the PLL loop bandwidth meets the system specification (block 308).

The value of being able to gauge the closed loop bandwidth of the PLL 20 to optimize the bandwidth has several benefits, according to some embodiments. For example, the settling time of the PLL may be accurately controlled. This may guarantee carrier frequency accuracy in packet data systems, as one example. The PLL loop bandwidth may be adjusted to accurately convey modulation. The PLL loop bandwidth may be adjusted to match another control loop, such as a loop conveying amplitude information. The PLL loop bandwidth may be adjusted to minimize the sum contribution of all PLL noise sources. The PLL loop bandwidth may be calculated again and again, for whatever purpose.

Some system designs employ "polar transmission schemes" in order to extend the battery life of a portable transceiver. Such transmitters rely upon splitting the signal modulation into amplitude and phase components, which are processed in separate loops and combined at the power amplifier. The accurate control and matching of the PLL loop bandwidth in the novel circuit 50 may be applied to such designs to efficiently ensure modulation accuracy.

Figure 7:
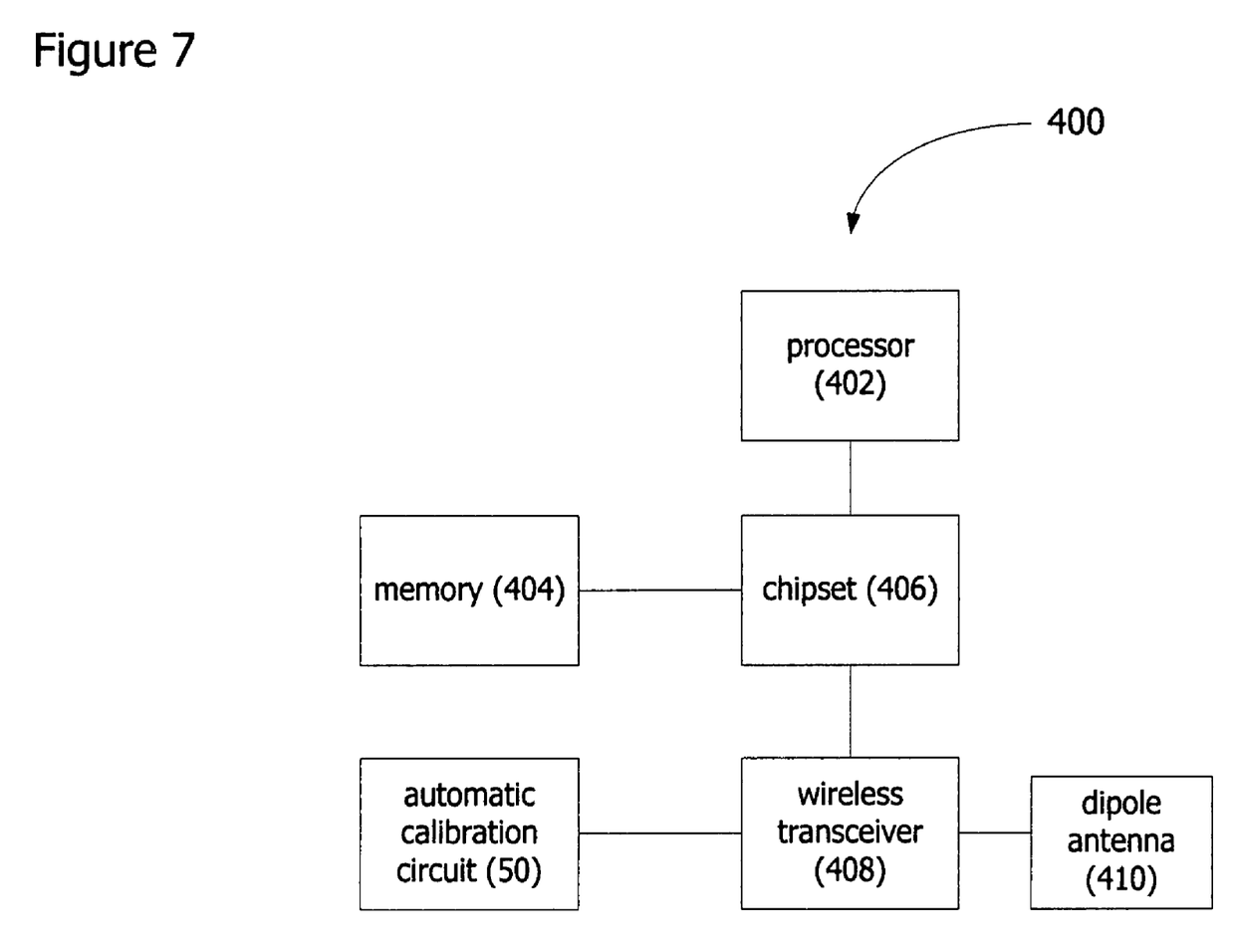
FIG. 7 is a block diagram of a system using the novel circuit of FIG. 2, according to some embodiments.

FIG. 7 is a block diagram of a processor-based system 400 utilizing the novel circuit 50 of FIG. 2, according to some embodiments. The processor-based system 400 includes a processor 402 coupled to a memory 404 and a chipset 406. The chipset 406 may support a myriad of functions not depicted in FIG. 7 for simplicity. One of the functions supported by the chipset is a wireless transceiver 408 coupled to a dipole antenna 410. The wireless transceiver 408 is controlled by PLL that is automatically calibrated using the novel circuit 50. The processor-based system 400 represents one example of the many applications in which the novel circuit 50 may be used.

While the disclosure has been described with respect to a limited number of embodiments, those skilled in the art will appreciate numerous modifications and variations therefrom. It is intended that the appended claims cover all such modifications and variations as fall within the true spirit and scope of the disclosed subject matter.

We claim:
1. A circuit, comprising:
  a phase-locked loop circuit forming a negative feedback loop, the phase-locked loop circuit comprising a phase frequency detector to receive a reference signal and a feedback signal, the feedback signal comprising a feedback phase; and
  loop bandwidth calibration logic to measure a bandwidth of the negative feedback loop and to modify the feedback phase, the loop bandwidth calibration logic comprising:
    adjust logic to adjust a phase of a signal entering the phase frequency detector;

phase overshoot detection logic coupled to detect a change in a voltage pulse sent by the phase frequency detector after the phase has been adjusted, wherein the voltage pulse change indicates that the phase-locked loop circuit has left a recovery stage and entered an overshoot stage;

a counter coupled to an adjustable clock, the counter to increment at each cycle of the clock, wherein the counter is reset when the adjust logic adjusts the phase of the signal entering the phase frequency detector; and an inverter to receive the feedback phase and generate an adjust phase, wherein the adjust phase is shifted relative to the feedback phase by 180 degrees;

wherein the loop bandwidth calibration logic measures a closed loop bandwidth of the phase-locked loop circuit based on a time difference between when the adjust logic adjusts the phase and the phase overshoot detection logic detects the voltage pulse change.

2. The circuit of claim 1, wherein the voltage pulse is proportional to a difference between the feedback phase and a reference phase.

3. The circuit of claim 1, wherein the adjust phase is shifted relative to the feedback phase by an amount other than 180 degrees.

4. The circuit of claim 1, the phase-locked loop to be adjusted based on the closed loop bandwidth, wherein—the adjustments are selected from a group consisting of:

modifying a tuning sensitivity of a voltage-controlled oscillator in the phase-locked loop;

modifying one or more component values of a loop filter in the phase-locked loop;

modifying one or more programmable values of a feedback divider in the phase-locked loop;

modifying a gain of the phase frequency detector; and modifying a gain of a charge pump in the phase-locked loop.

5. A circuit, comprising:

a phase-locked loop circuit forming a negative feedback loop, the phase-locked loop circuit comprising a phase frequency detector to receive a reference signal and a feedback signal, the reference signal comprising a reference phase; and loop bandwidth calibration logic to measure a bandwidth of the negative feedback loop and to modify the reference phase, the loop bandwidth calibration logic comprising:

adjust logic to adjust a phase of a signal entering the phase frequency detector;

phase overshoot detection logic coupled to detect a change in a voltage pulse sent by the phase frequency detector after the phase has been adjusted, wherein the voltage pulse change indicates that the phase-locked loop circuit has left a recovery stage and entered an overshoot stage;

a counter coupled to an adjustable clock, the counter to increment at each cycle of the clock, wherein the counter is reset when the adjust logic adjusts the phase of the signal entering the phase frequency detector; and an inverter to receive the reference phase and generate the adjust phase, wherein the adjust phase is shifted relative to the reference phase by 180 degrees;

wherein the loop bandwidth calibration logic measures a closed loop bandwidth of the phase-locked loop circuit based on a time difference between when the adjust logic adjusts the phase and the phase overshoot detection logic detects the voltage pulse change.

6. The circuit of claim 5, wherein the voltage pulse is proportional to a difference between a feedback phase and the reference phase.

7. The circuit of claim 5, wherein the adjust phase is shifted relative to the reference phase by an amount other than 180 degrees.

8. The circuit of claim 5, the phase-locked loop to be adjusted based on the closed loop bandwidth, wherein—the adjustments are selected from a group consisting of:

modifying a tuning sensitivity of a voltage-controlled oscillator in the phase-locked loop;

modifying one or more component values of a loop filter in the phase-locked loop;

modifying one or more programmable values of a feedback divider in the phase-locked loop;

modifying a gain of the phase frequency detector; and modifying a gain of a charge pump in the phase-locked loop.

* * * * *